US012750050B2

(12) United States Patent
Mudda et al.

(10) Patent No.: US 12,750,050 B2
(45) Date of Patent: Sep. 29, 2026

(54) ISOLATED DIGITAL INPUT RECEIVER WITH SINK AND SOURCE MODE SUPPORT

(71) Applicant: TEXAS INSTRUMENTS INCORPORATED, Dallas, TX (US)

(72) Inventors: Himanth Mudda, Kakinada (IN); Tarunvir Singh, Bangalore (IN); Anant Shankar Kamath, Bangalore (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/657,273

(22) Filed: May 7, 2024

(65) Prior Publication Data

US 2024/0380397 A1 Nov. 14, 2024

(30) Foreign Application Priority Data

May 8, 2023 (IN) ............................. 202341032315
Feb. 26, 2024 (IN) ............................. 202441013673

(51) Int. Cl.
*H03K 17/51* (2006.01)
*H03K 19/20* (2006.01)

(52) U.S. Cl.
CPC ............. *H03K 17/51* (2013.01); *H03K 19/20* (2013.01)

(58) Field of Classification Search
CPC ........ H03K 17/51; H03K 17/30; H03K 17/56; H03K 17/002; H03K 17/005; H03K 17/041; H03K 17/04106; H03K 17/0412; H03K 19/20; H03K 19/02
USPC ........ 327/50, 56, 63, 64, 90, 93, 77, 99, 112
See application file for complete search history.

(56) References Cited

U.S. PATENT DOCUMENTS 12,294,802 B2 * 5/2025 Suess .................. H04N 25/707
12,431,997 B2 * 9/2025 Baek .................. H03K 19/1737

* cited by examiner

*Primary Examiner* — Hai L Nguyen
(74) *Attorney, Agent, or Firm* — Xianghui Huang; Frank D. Cimino

(57) ABSTRACT

In some examples, a circuit includes a sink/source mode detector configured to compare a voltage provided at the first I/O terminal of the circuit to a first reference signal; determine, responsive to the voltage provided at the first I/O terminal exceeding the first reference signal, that the circuit is in a source mode; determine, responsive to the voltage provided at the first I/O terminal not exceeding the first reference signal, that the circuit is in a sink mode; responsive to determining that the circuit is in the source mode and an input signal of the circuit has a value less than a second reference signal, control a first switch to form a first current path between a voltage supply terminal and the first I/O terminal of the circuit; and responsive to determining that the circuit is in the sink mode and the input signal has a value greater than the second reference signal, control a second switch to form a second current path between a ground terminal and the first I/O terminal of the circuit.

12 Claims, 5 Drawing Sheets

ISOLATED DIGITAL INPUT RECEIVER WITH SINK AND SOURCE MODE SUPPORT

CROSS-REFERENCE TO RELATED APPLICATIONS

The present application claims priority to India Provisional Patent Application No. 202441013673, which was filed Feb. 26, 2024, is titled "ARCHITECTURE TO SUPPORT BOTH SINK AND SOURCE MODE IN DIGITAL INPUT RECEIVERS," and India Provisional Patent Application No. 202341032315, which was filed May 8, 2023, is titled "ARCHITECTURE TO SUPPORT BOTH SINK AND SOURCE MODE IN DIGITAL INPUT RECEIVERS," and both applications are hereby incorporated herein by reference in its entirety.

BACKGROUND

An isolated digital input circuit provides galvanic isolation from an input to a digital or logic output, such as for a host controller. The isolated digital input circuit may be capable of operating in multiple modes of operation.

SUMMARY

In some examples, a circuit includes a sink/source mode detector, a first logic circuit, a second logic circuit, a first switch, and a second switch. The sink/source mode detector has an input terminal and an output terminal, the input terminal of the sink/source mode detector coupled to a first input/output (I/O) terminal of the circuit. The first logic circuit has an output terminal and first and second input terminals, the second input terminal of the first logic circuit coupled to the output terminal of the sink/source mode detector. The second logic circuit has an input terminal and an output terminal, the input terminal of the second logic circuit coupled to the output terminal of the sink/source mode detector. The third logic circuit has an output terminal and first and second input terminals, the second input terminal of the third logic circuit coupled to the output terminal of the second logic circuit. The first switch has a control terminal and first and second terminals, the first terminal of the first switch coupled to a voltage supply terminal, the second terminal of the first switch coupled to the first I/O terminal of the circuit, and the control terminal of the first switch coupled to the output terminal of the third logic circuit. The second switch has a control terminal and first and second terminals, the first terminal of the second switch coupled to the first I/O terminal of the circuit, the second terminal of the second switch coupled to a ground terminal, and the control terminal of the second switch coupled to the output terminal of the first logic circuit.

In some examples, a circuit includes a sink/source mode detector. The sink/source mode detector has an input terminal and an output terminal. The input terminal of the sink/source mode detector is coupled to a first input/output (I/O) terminal of the circuit. The sink/source mode detector is configured to compare a voltage provided at the first I/O terminal of the circuit to a first reference signal. The sink/source mode detector is also configured to determine, responsive to the voltage provided at the first I/O terminal exceeding the first reference signal, that the circuit is in a source mode. The sink/source mode detector is also configured to determine, responsive to the voltage provided at the first I/O terminal not exceeding the first reference signal, that the circuit is in a sink mode. The sink/source mode detector is also configured to, responsive to determining that the circuit is in the source mode and an input signal of the circuit has a value less than a second reference signal, control a first switch to form a first current path between a voltage supply terminal and the first I/O terminal of the circuit. The sink/source mode detector is also configured to, responsive to determining that the circuit is in the sink mode and the input signal has a value greater than the second reference signal, control a second switch to form a second current path between a ground terminal and the first I/O terminal of the circuit.

In some examples, a system includes an isolated input circuit, a first light emitting diode (LED), a second LED, a resistor, a first diode, a second diode, a third diode, and a fourth diode. The isolated input circuit has first and second reference input terminals, first and second input/output (I/O) terminals, and an output terminal. The first LED has an anode and a cathode, the anode of the first LED coupled to the second I/O terminal and the cathode of the first LED coupled to a first supply terminal. The second LED has an anode and a cathode, the cathode of the second LED coupled to the second I/O terminal and the anode of the second LED coupled to the first supply terminal. The resistor has first and second terminals, the first terminal of the resistor coupled to a second supply terminal. The first diode has an anode and a cathode, the anode of the first diode coupled to the second terminal of the resistor, and the cathode of the first diode coupled to the first reference input terminal. The second diode has an anode and a cathode, the anode of the second diode coupled to the second reference input terminal, and the cathode of the second diode coupled to the second supply terminal. The third diode has an anode and a cathode, the anode of the third diode coupled to the second reference input terminal, and the cathode of the third diode coupled to the second terminal of the resistor. The fourth diode has an anode and a cathode, the anode of the fourth diode coupled to the second supply terminal, and the cathode of the fourth diode coupled to the first reference input terminal.

DETAILED DESCRIPTION

Figure 1:
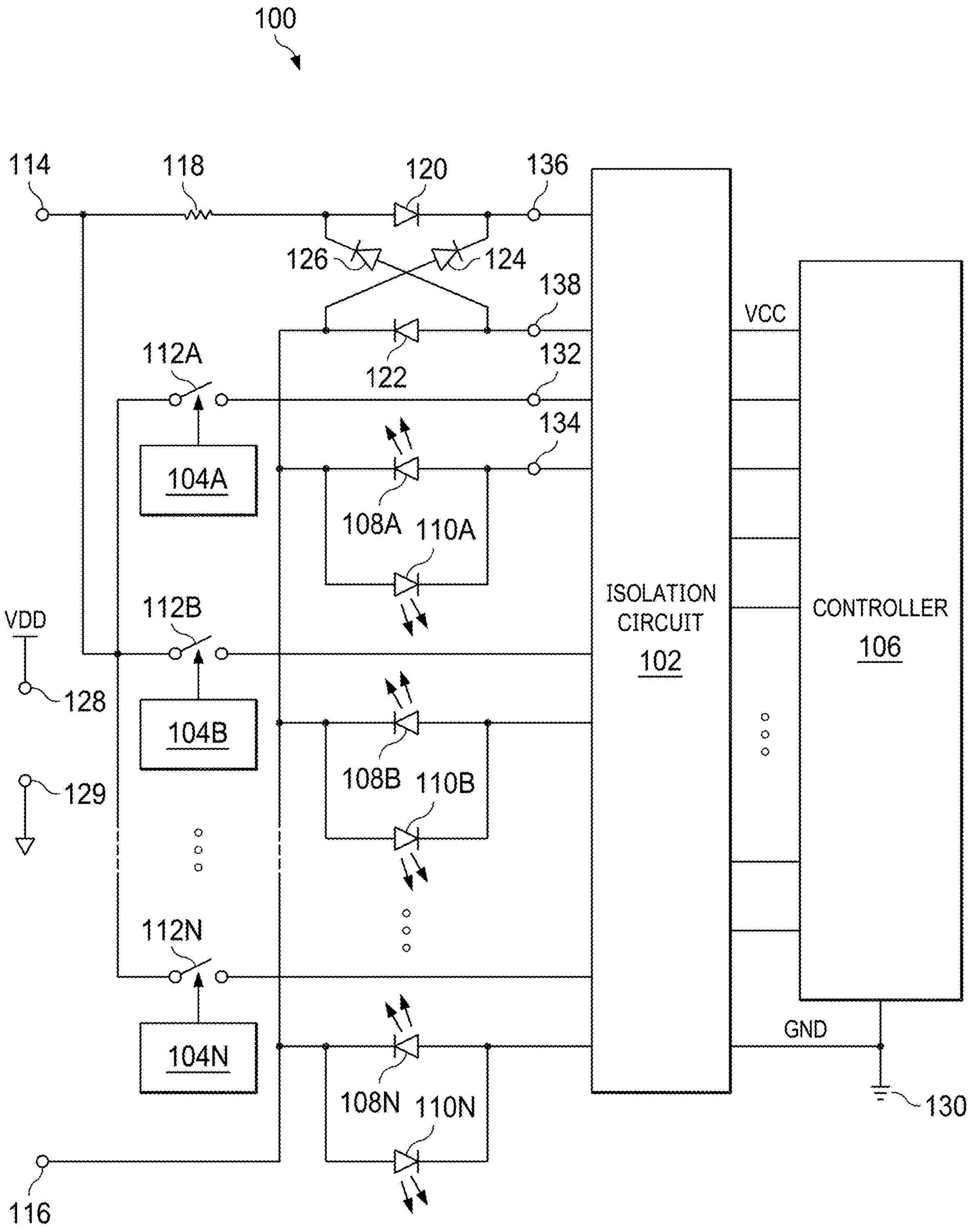
FIG. 1 is a block diagram of an example system.

As described above, an isolated digital input circuit provides galvanic isolation from an input to a digital or logic output, such as for a host controller. The isolated digital input circuit may be capable of operating in multiple modes of operation, such as in a sink mode of operation or in a source mode of operation. To support both sink and source modes of operation, certain challenges may exist. At least one such challenge may be the providing of surge, or transient over-voltage, protection for the isolated digital input circuit irrespective of the mode of operation in which it is operating. For example, a resistive component for surge protection may couple to the isolated digital input circuit in different ways based on the mode of operation in which the isolated digital input circuit is operating. However, the mode of operation may not be known beforehand. Therefore, an architecture of the isolated digital input circuit may need to provide support for multiple functional arrangements of the resistive component in a device including the isolated digital input circuit without necessitating a physical rearrangement of the resistive component with respect to the isolated digital input circuit. Similarly, it may be useful to provide a visual indication that indicates whether an output signal of the isolated digital input circuit has a value of logic high (e.g., "1") or logic low (e.g., "0"). In various examples, the visual indication indicates whether a particular switch is open or closed, which may be useful in maintenance and inspection of systems and may be mandated by certain industry standards. However, a visual indicator, such as a light emitting diode (LED) may also couple to the isolated digital input circuit in different ways based on the mode of operation in which the isolated digital input circuit is operating. Thus, to support both sink and source modes, the isolated digital input circuit may perform mode detection to determine, based on external couplings, in which mode the isolated digital input circuit is operating.

Examples of this disclosure provide for an isolated digital input circuit including a sink/source mode detector. Based on a detection performed by the sink/source mode detector, the isolated digital input circuit controls one or more internal components of the isolated digital input circuit and one or more external components coupled to the isolated digital input circuit, to perform various functions. For example, responsive to determining that the isolated digital input circuit is in the sink mode, the sink/source mode detector facilitates the formation of a first current path to de-activate a first visual indicator. Conversely, responsive to determining that the isolated digital input circuit is in the source mode, the sink/source mode detector facilitates the formation of a second current path to de-activate a second visual indicator. In some examples, the sink/source mode detector may further control a data selection circuit, such as a multiplexer, to select an input signal of the data selection circuit for output by the data selection circuit. For example, responsive to determining that the isolated digital input circuit is in the sink mode, the sink/source mode detector controls the data selection circuit to provide a first input signal as its output signal. Conversely, responsive to determining that the isolated digital input circuit is in the source mode, the sink/source mode detector controls the data selection circuit to provide a second input signal as its output signal. To determine whether the isolated digital input circuit is in the sink mode or the source mode of operation, in some examples, the sink/source mode detector compares an input voltage of the sink/source mode detector to a first threshold voltage. In some examples, the first threshold voltage is proportional to VDD, such as being a fractional value of VDD. In some examples, the first threshold voltage is approximately one-half of VDD.

FIG. 1 is a block diagram of an example system 100. In some examples, the system 100 includes an isolated digital input circuit 102 (also referred to as an isolation circuit 102), one or more sensors 104 (e.g., sensor 104A, 104B, . . . 104*n*), and a controller 106. In various examples, the system 100 is any system in which the isolated digital input circuit 102 provides galvanic isolation between the sensors 104 and the controller 106. For example, the system 100 may be a motor control system. As shown in FIG. 1, the system 100 also includes LEDs 108 (e.g., LED 108A, 108B, . . . 104*n*), LEDs 110 (e.g., LED 110A, 110B, . . . 110*n*), switches 112 (e.g., switch 112A, 112B, 112*n*), a resistor 118, and diodes 120, 122, 124, and 126, a voltage supply terminal 128 (at which a supply voltage VDD is provided), a (common) terminal 114, a (common) terminal 116, and a ground terminal 130 (at which a ground voltage potential is provided). In various examples, VDD is provided by any circuit capable of providing a reference voltage, the scope of which is not limited herein. Also shown in FIG. 1, the isolated digital input circuit 102 is a three-channel device. For example, the isolated digital input circuit 102 can receive signals originating from three distinct input data sources (e.g., the sensors 104A, 104B, . . . 104*n*) and provide three distinct corresponding outputs. Each channel may be associated with a sensor 104, a LED 108, a LED 110, a switch 112, and have corresponding circuitry (not shown) included in the isolated digital input circuit 102. FIG. 1 shows the isolated digital input circuit 102 having three channels. However, in various other examples the isolated digital input circuit 102 has any suitable number of channels greater than or less than three. In some examples, the isolated digital input circuit 102 is an eight-channel device.

In an example architecture of the system 100, the isolated digital input circuit 102 is coupled to the controller 106 via any suitable number of couplings. In some examples, the isolated digital input circuit 102 includes at least a voltage supply terminal coupled to the controller 106 (at which a supply voltage VCC is, for example, provided by the controller 106), and each channel of the isolated digital input circuit 102 is coupled to the controller 106 by a data output coupling, and in some examples, a mode indication coupling. The isolated digital input circuit 102 and the controller 106 may also couple to the ground terminal 130.

Continuing with the example architecture of the system 100, the LED 108A has an anode coupled to a second input/output (I/O) terminal 134 of the isolated digital input circuit 102, and has a cathode coupled to the common terminal 116. The LED 110A has an anode coupled to the cathode of the LED 108A, and has a cathode coupled to the second I/O terminal 134 of the isolated digital input circuit 102. The switch 112A has a first terminal coupled to the common terminal 114 and has a second terminal coupled to a first I/O terminal 132 of the isolated digital input circuit 102. The switch 112A further has a control terminal coupled to the sensor 104A to enable control of the switch 112A by the sensor 104A. In other examples, the switch 112A and the sensor 104A may be the same device such that, responsive to the sensor 104A sensing the presence of a condition, the sensor 104A provides a signal to the first I/O terminal 132 of the isolated digital input circuit 102 having a value approximately equal to a value of a signal provided at the common terminal 114. In an example, the LEDs 108B, 110B, switch 112B, and sensor 104B, and the LEDs 108*n*, 110*n*, switch 112*n*, and sensor 104*n* are coupled as shown in FIG. 1 in a manner substantially like that described above with respect to the LEDs 108A, 110A, switch 112A, and sensor 104A. Accordingly, such description is not repeated herein.

The resistor 118 has a first terminal coupled to the common terminal 114 and has a second terminal. The diode 120 has an anode coupled to the second terminal of the resistor 118, and has a cathode coupled to a first reference input terminal 136 of the isolated digital input circuit 102. The diode 122 has an anode coupled to a second reference input terminal 138 of the isolated digital input circuit 102, and has a cathode coupled to the common terminal 116. The diode 124 has an anode coupled to the common terminal 116 and has a cathode coupled to the first reference input terminal 136 of the isolated digital input circuit 102. The diode 126 has an anode coupled to the second reference input terminal 138 of the isolated digital input circuit 102, and has a cathode coupled to the second terminal of the resistor 118.

Operation of one channel of the isolated digital input circuit 102 is described below. Description is provided for one channel of the isolated digital input circuit 102. However, the description may be applicable to operation of other channels of the isolated digital input circuit 102 which are substantially like the described channel. In an example of operation of the system 100, the isolated digital input circuit 102 operates in a source mode or in a sink mode of operation. The sink mode of operation will be described first. In the sink mode of operation, the common terminal 114 is coupled to the voltage supply terminal 128, and the common terminal 116 is coupled to the ground terminal 130. In this mode of operation, the diodes 124, 126 may be blocking diodes through which substantially no current flows. Current flows from a voltage supply coupled to the voltage supply terminal 128 and common terminal 114, through the resistor 118 and diode 120 to the isolated digital input circuit 102. Current further flows from the isolated digital input circuit 102, through the diode 122 to the common terminal 116 and ground terminal 130. In an example, the resistor 118 operates as a surge protection device for the isolated digital input circuit 102. For example, the surge protection mitigates effects of surges from electromagnetic coupling of lightning strikes or other transient voltage events affecting the system 100.

In some examples, the isolated digital input circuit 102 determines whether it is coupled in an arrangement to operate in the sink mode of operation or the source mode of operation by detecting a voltage provided at the second I/O terminal 134. The voltage may be representative of a voltage drop across the LEDs 108A, 110A, for example. Responsive to the voltage provided at the second I/O terminal 134 the isolated digital input circuit 102 being less than a threshold voltage, the isolated digital input circuit 102 determines that the isolated digital input circuit 102 is coupled in an arrangement to operate in the sink mode of operation. Responsive to the voltage provided at the second I/O terminal 134 of the isolated digital input circuit 102 being greater than the threshold voltage, the isolated digital input circuit 102 determines that the isolated digital input circuit 102 is coupled in an arrangement to operate in the source mode of operation. In some examples, the threshold voltage has a value approximately equal to one-half of VDD. In such an example, VDD has a value greater than at least two times a diode voltage drop (e.g., LED voltage drop) of the LEDs 108A, 110A.

In an example, responsive to the sensor 104A providing a signal having an asserted (e.g., logic high) value to the switch 112A, the switch 112A closes and provides a signal at the first I/O terminal 132 of the isolated digital input circuit 102 having a voltage approximately equal to VDD (e.g., logic high). The sensor 104A may be a proximity sensor, a temperature sensor, a pressure sensor, an optical sensor, or the like. In an example, the sensor 104A provides the signal having the asserted value responsive to a monitored event occurring, such as an object crossing a certain monitored location, a temperature meeting a threshold, a pressure meeting a threshold, or the like. In another example, responsive to the sensor 104A detecting the presence of a monitored condition, the sensor 104A provides the signal having the value approximately equal to VDD at the first I/O terminal 132 of the isolated digital input circuit 102 directly. Responsive to receiving the signal having the logic high value at the first I/O terminal of the isolated digital input circuit 102 and the isolated digital input circuit 102 determining that it is operating in the sink mode of operation, the isolated digital input circuit 102 provides a data output signal to the controller 106 having a logic high value. The data output signal having the logic high value indicates that the switch 112A is closed. Responsive to the isolated digital input circuit 102 determining that it is operating in the sink mode of operation and the isolated digital input circuit 102 providing the data output signal having the logic high value, the isolated digital input circuit 102 causes the LED 108A to become illuminated.

Conversely, in an example, responsive to the sensor 104A providing a signal having a deasserted (e.g., logic low) value to the switch 112A, the switch 112A opens and a signal is provided at the first I/O terminal 132 of the isolated digital input circuit 102 having a voltage approximately equal to a voltage provided at the second I/O terminal 134 of the isolated digital input circuit 102 (e.g., approximately GND in this mode of operation). For example, if the monitored condition is less than a threshold or limit, or a monitored activity has not occurred, the sensor 104A provides the signal having the deasserted value. In another example, responsive to the sensor 104A detecting the absence of a monitored condition (or not detecting the presence of the monitored condition), the sensor 104A provides a signal having the deasserted value at the first I/O terminal 132 of the isolated digital input circuit 102 directly. Responsive to receiving the signal having the logic low value at the first I/O terminal 132 of the isolated digital input circuit 102 and the isolated digital input circuit 102 determining that it is operating in the sink mode of operation, the isolated digital input circuit 102 provides a data output signal to the controller 106 having a logic low value. The data output signal having the logic low value indicates that the switch 112A is open. Responsive to the isolated digital input circuit 102 determining that it is operating in the sink mode of operation and the isolated digital input circuit 102 providing the data output signal having the logic low value, the isolated digital input circuit 102 forms a first current path. Approximately no voltage potential difference exists across the LED 108A while the first current path is formed, thereby causing the LED 108A to not be illuminated.

Next, the source mode of operation is described. In the source mode of operation, the common terminal 114 is coupled to the ground terminal 130 and the common terminal 116 is coupled to the voltage supply terminal 128. In this mode of operation, the diodes 120, 122 may be blocking diodes through which substantially no current flows. Current flows from a voltage supply coupled to the voltage supply terminal 128 and common terminal 116, through the diode 124 to the isolated digital input circuit 102. Current further flows from the isolated digital input circuit 102, through the diode 126 and the resistor 118 to the common terminal 114 and ground terminal 130.

The isolated digital input circuit 102 determines whether it is coupled in an arrangement to operate in the sink mode of operation or the source mode of operation by detecting a voltage provided at the second I/O terminal 134, as described above with respect to the sink mode of operation. In an example, responsive to the sensor 104A providing a signal having an asserted (e.g., logic high) value to the switch 112A, the switch 112A closes and provides a signal at the first I/O terminal 132 of the isolated digital input circuit 102 having a voltage approximately equal to GND (e.g., logic low). In another example, responsive to the sensor 104A detecting the presence of a monitored condition, the sensor 104A provides the signal having the value approximately equal to GND at the first I/O terminal 132 of the isolated digital input circuit 102 directly. Responsive to receiving the signal having the logic low value at the first I/O terminal 132 of the isolated digital input circuit 102 and the isolated digital input circuit 102 determining that it is operating in the source mode of operation, the isolated digital input circuit 102 provides a data output signal to the controller 106 having a logic high value. Responsive to the isolated digital input circuit 102 determining that it is operating in the source mode of operation and the isolated digital input circuit 102 providing the data output signal having the logic high value, the isolated digital input circuit 102 causes the LED 110A to become illuminated.

Conversely, in an example, responsive to the sensor 104A providing a signal having a deasserted (e.g., logic low) value to the switch 112A, the switch 112A opens and a signal is provided at the first I/O terminal 132 of the isolated digital input circuit 102 having a voltage approximately equal to a voltage provided at the second I/O terminal 134 of the isolated digital input circuit 102 (e.g., approximately VDD in this mode of operation). In another example, responsive to the sensor 104A detecting the absence of a monitored condition (or not detecting the presence of the monitored condition), the sensor 104A provides a signal having the value approximately equal to VDD at the first I/O terminal 132 of the isolated digital input circuit 102 directly. Responsive to receiving the signal approximately equal to VDD at the first I/O terminal 132 of the isolated digital input circuit 102 and the isolated digital input circuit 102 determining that it is operating in the source mode of operation, the isolated digital input circuit 102 provides a data output signal to the controller 106 having a logic low value. Responsive to the isolated digital input circuit 102 determining that it is operating in the source mode of operation and the isolated digital input circuit 102 providing the data output signal having the value approximately equal to VDD, the isolated digital input circuit 102 forms a second current path causing approximately no potential difference to exist across the LED 110A, thereby causing the LED 110A to not be illuminated.

In this way, based on a voltage provided at the second I/O terminal 134 of the isolated digital input circuit 102, the isolated digital input circuit 102 determines whether it is coupled in an arrangement to operate in the sink mode of operation or the source mode of operation. Based on this determination of mode of operation, the isolated digital input circuit 102 provides corresponding control of one or more devices to provide an output signal of the isolated digital input circuit 102, illuminate or not illuminate one or more of the LEDs 108A, 110A, or perform any other suitable actions. Furthermore, the arrangement of the diodes 120, 122, 124, 126 enables the resistor 118 to provide surge protection or mitigation for the isolated digital input circuit 102 irrespective of whether the isolated digital input circuit 102 is operating in the sink mode of operation or the source mode of operation.

Figure 2:
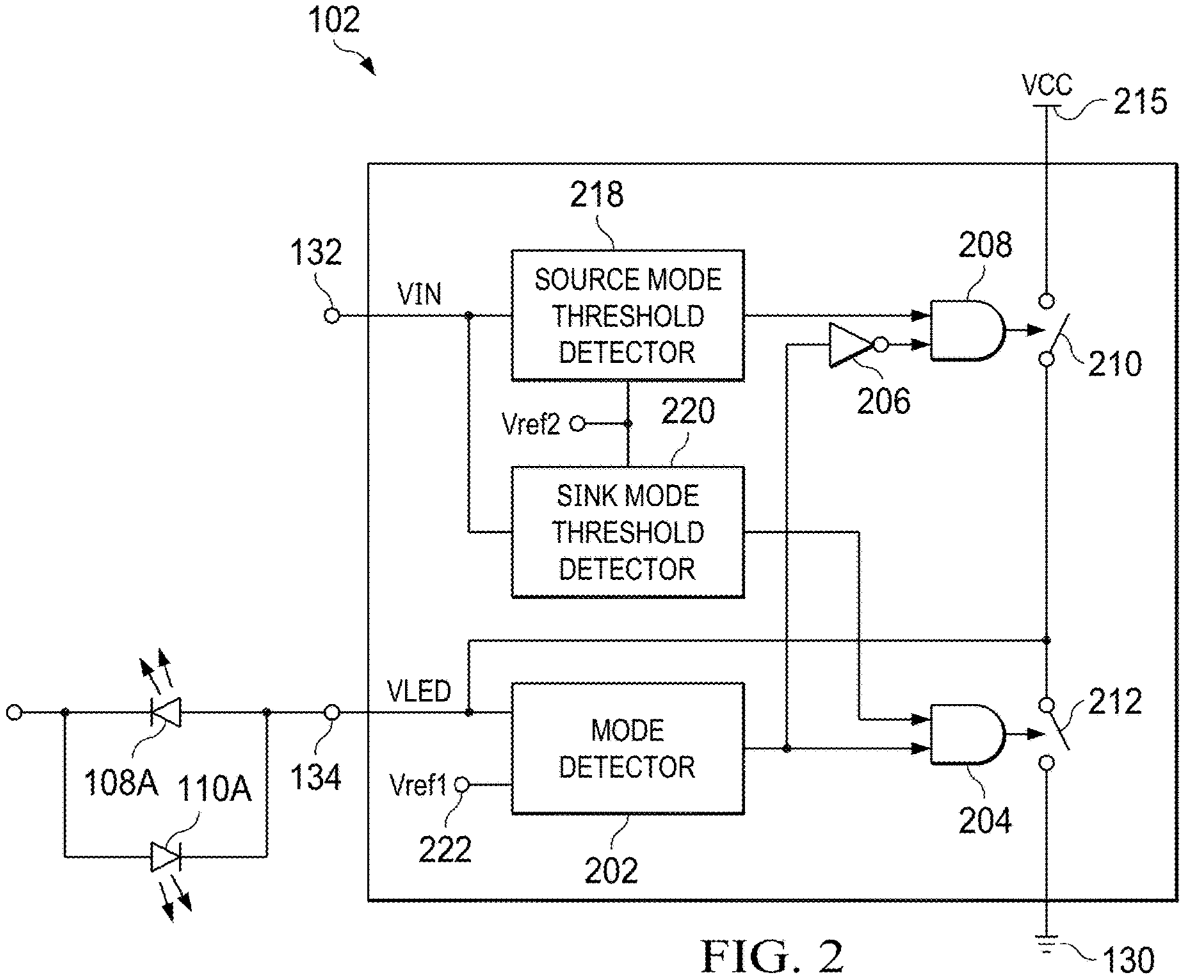
FIG. 2 is a block diagram of an example of an isolated digital input circuit.

FIG. 2 is a block diagram of an example of the isolated digital input circuit 102. Certain components of the isolated digital input circuit 102 are shown and described with respect to FIG. 2. However, in various examples the isolated digital input circuit 102 may include other components not shown in FIG. 2. In an example, the isolated digital input circuit 102 includes a sink/source mode detector 202, a first logic circuit 204, a second logic circuit 206, a third logic circuit 208, a first switch 210, a second switch 212, a source mode threshold detector 218, and a sink mode threshold detector 220. Also shown is the first I/O terminal 132, the second I/O terminal 134, a voltage supply terminal 215 (at which VCC is provided, such as by the controller 106), and the ground terminal 130. In some examples, the logic circuit 204 is an AND logic circuit, the logic circuit 206 is an inverter logic circuit, and the logic circuit 208 is an AND logic circuit. In other examples, the logic circuit 206 may be omitted and an input of the logic circuit 208 may be an inverted input. In an example, the components of the isolated digital input circuit 102 shown in FIG. 2 are representative of one channel, or a portion of one channel, of the isolated digital input circuit 102.

In an example architecture of the isolated digital input circuit 102, the sink/source mode detector 202 has an input terminal coupled to the second I/O terminal 134 of the isolated digital input circuit 102 and has an output terminal. The logic circuit 204 has first and second inputs, and an output terminal, with the second input terminal of the logic circuit 204 coupled to the output terminal of the sink/source mode detector 202. The logic circuit 206 has input and output terminals, with the input terminal of the logic circuit 206 coupled to the output terminal of the sink/source mode detector 202. The logic circuit 208 has first and second inputs, and an output terminal, with the second input terminal of the logic circuit 208 coupled to the output terminal of the logic circuit 206. The switch 210 has a first terminal coupled to the voltage supply terminal 215 and a second terminal coupled to the second I/O terminal 134. The switch 210 also has a control terminal coupled to the output terminal of the logic circuit 208. The switch 212 has a first terminal coupled to the second I/O terminal 134 and a second terminal coupled to the ground terminal 130. The switch 212 also has a control terminal coupled to the output terminal of the logic circuit 204. The source mode threshold detector 218 has an input coupled to the first I/IO terminal 132 of the isolated digital input circuit 102 and has an output terminal coupled to the first input terminal of the logic circuit 208. The sink mode threshold detector 220 has an input coupled to the first I/IO terminal 132 of the isolated digital input circuit 102 and has an output terminal coupled to the first input terminal of the logic circuit 204.

In an example of operation of the isolated digital input circuit 102, the sink/source mode detector 202 determines whether the sink/source mode detector 202 is coupled in an arrangement to operate in the sink mode of operation or the source mode of operation based on a voltage provided at the second I/O terminal 134. In some examples, the sink/source mode detector 202 also has a reference voltage terminal 222 to receive a first reference voltage (Vref1). The first reference voltage may have a value approximately equal to VDD/2, as described above herein. The first reference voltage may be provided at the reference voltage terminal 222 according to any suitable circuit architecture or process, the scope of which is not limited herein. The sink/source mode detector 202 compares the voltage provided at the second I/O terminal 134 to the first reference voltage according to any suitable circuit architecture or process, the scope of which is not limited herein. In some examples, the sink/source mode detector 202 includes a comparator (not shown) to perform the comparison. Responsive to the voltage provided at the second I/O terminal 134 exceeding the first reference voltage, the sink/source mode detector 202 provides a mode signal indicating that the isolated digital input circuit 102 is operating in the source mode of operation. Conversely, responsive to the voltage provided at the second I/O terminal 134 being less than the first reference voltage, the sink/source mode detector 202 provides the mode signal indicating that the isolated digital input circuit 102 is operating in the sink mode of operation. In some examples, the mode signal has a logic low value to indicate that the isolated digital input circuit 102 is operating in the sink mode of operation. In such examples, the mode signal has a logic high value to indicate that the isolated digital input circuit 102 is operating in the source mode of operation.

In some examples, the source mode threshold detector 218 compares a voltage provided at the first I/O terminal 132 to a second reference voltage (Vref2). In some examples, the voltage provided at the first I/O terminal may be representative of a data value. In some examples, the second reference voltage may have any suitable value, the scope of which is not limited herein. In at least one examples, the second reference voltage has a value of about 6 volts (V). Responsive to the voltage provided at the first I/O terminal 132 being greater than Vref2, the source mode threshold detector 218 provides an output signal having an asserted (e.g., logic high) value. Otherwise, the source mode threshold detector 218 provides the output signal having a deasserted (e.g., logic low) value. Similarly, the sink mode threshold detector 220 compares the voltage provided at the first I/O terminal 132 to Vref2. Responsive to the voltage provided at the first I/O terminal 132 being less than Vref2, the sink mode threshold detector 220 provides an output signal having an asserted (e.g., logic high) value. Otherwise, the sink mode threshold detector 220 provides the output signal having a deasserted (e.g., logic low) value.

Responsive to the output signal of the source mode threshold detector 218 having a logic low value and the sink/source mode detector 202 providing the mode signal indicating that the isolated digital input circuit 102 is operating in the source mode of operation, the logic circuit 208 controls the switch 210 to close, forming a current path between the voltage supply terminal 215 and the second I/O terminal 134. In this way, the LEDs 108A, 110A coupled to the second I/O terminal 134 may be controlled to not be illuminated, such as resulting from approximately no difference in voltage potential existing across the LEDs 108A, 110A. In an example, the LEDs 108A, 110A not being illuminated indicates that the switch 112A is open, and the data output signal of the isolated digital input circuit 102 has a logic low value.

Conversely, responsive to the output signal of the sink mode threshold detector 218 having a logic low value and the sink/source mode detector 202 providing the mode signal indicating that the isolated digital input circuit 102 is operating in the sink mode of operation, the logic circuit 208 controls the switch 212 to close, forming a current path between the ground terminal 130 and the second I/O terminal 134. In this way, the LEDs 108A, 110A coupled to the second I/O terminal 134 may be controlled to not be illuminated, such as resulting from approximately no difference in voltage potential existing across the LEDs 108A, 110A. In an example, the switches 210, 212 may be controlled to have mutually exclusive states. For example, other than during a transition period during which a respective switch 210, 212 is opening or closing, while one of the switches 210, 212 is open, the other is closed, and vice versa.

Figure 3:
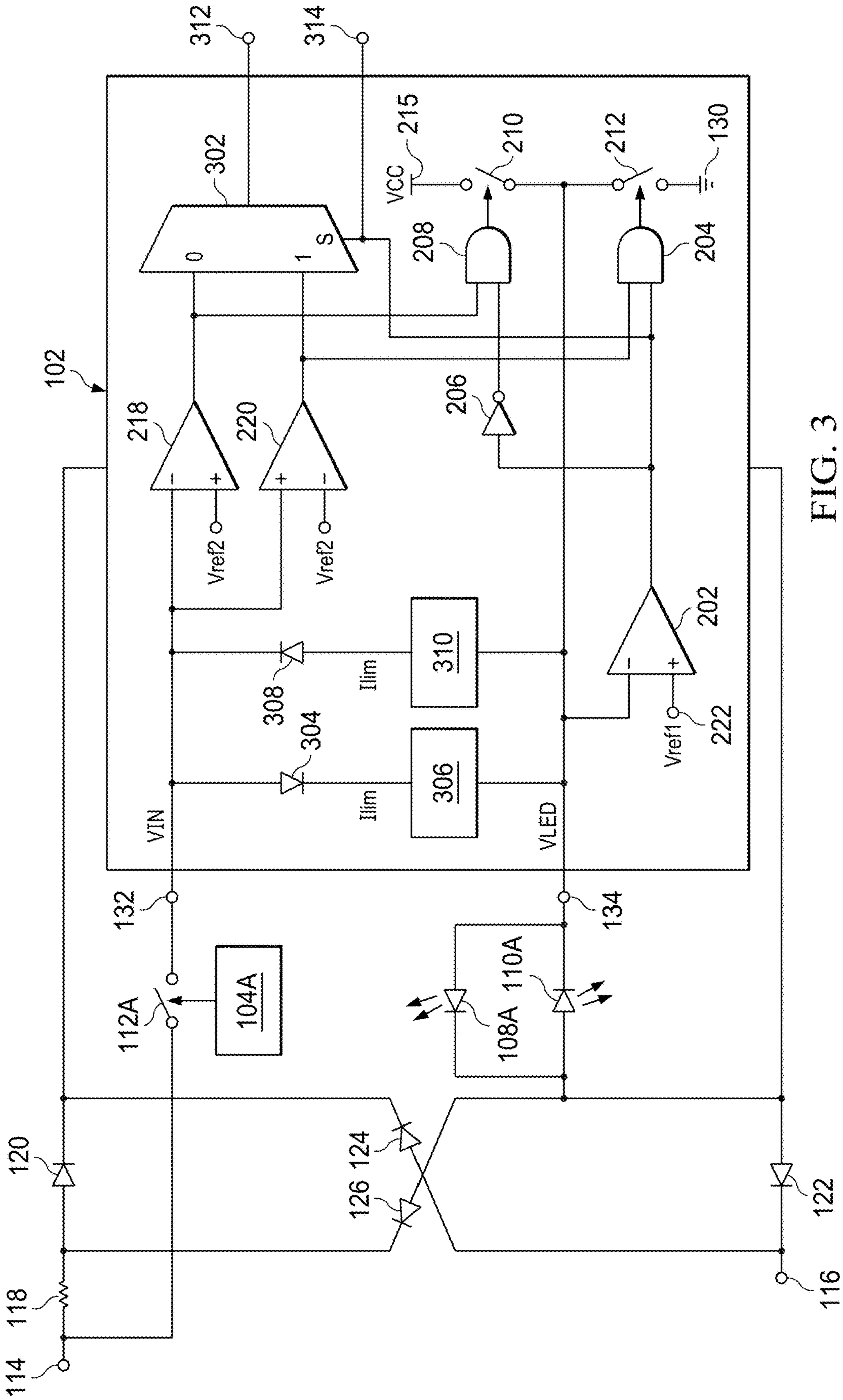
FIG. 3 is a schematic diagram of an example of an isolated digital input circuit.

FIG. 3 is a schematic diagram of an example of the isolated digital input circuit 102. FIG. 3 further includes supporting components with respect to the system 100 for operation of one channel of the isolated digital input circuit 102, as described above. In an example, the isolated digital input circuit 102 includes the mode detector 202 (shown implemented as a comparator), the logic circuits 204, 206, 208, the switches 210, 212, the source mode threshold detector 218 (shown implemented as a comparator), the sink mode threshold detector 220 (shown implemented as a comparator), a multiplexer 302, diodes 304, 308, and current limiting circuits 306, 310.

In an example architecture of the isolated digital input circuit 102, the sink/source mode detector 202 has a first input (e.g., a non-inverting or positive input) terminal at which Vref1 is provided, such as by coupling the first input terminal of the sink/source mode detector 202 to any other suitable terminal. The sink/source mode detector 202 further has a second input (e.g., an inverting or negative input) terminal coupled to the anode of the LED 108A and the cathode of the LED 110A. In some examples, the second input terminal of the sink/source mode detector 202 is an I/O terminal (e.g., the second I/O terminal 134) of the isolated digital input circuit 102. The logic circuit 204 has first and second inputs, and an output terminal, with the second input terminal of the logic circuit 204 coupled to an output terminal of the sink/source mode detector 202. The logic circuit 206 has input and output terminals, with the input terminal of the logic circuit 206 coupled to the output terminal of the sink/source mode detector 202. The logic circuit 208 has first and second inputs, and an output terminal, with the second input terminal of the logic circuit 208 coupled to the output terminal of the logic circuit 206. The switch 210 has a first terminal coupled to the voltage supply terminal 215 and a second terminal coupled to the second I/O terminal 134. The switch 210 also has a control terminal coupled to the output terminal of the logic circuit 208. The switch 212 has a first terminal coupled to the second I/O terminal 134 and a second terminal coupled to the ground terminal 130. The switch 212 also has a control terminal coupled to the output terminal of the logic circuit 204.

The source mode threshold detector 218 has a first input (e.g., an inverting or negative input) terminal coupled to the second terminal of the switch 112A. The source mode threshold detector 218 further has a second input (e.g., a non-inverting or positive input) terminal at which Vref2 is provided, such as by coupling the first input terminal of the sink/source mode detector 202 to any other suitable terminal. The output terminal of the source mode threshold detector 218 is coupled to the first input terminal of the logic circuit 208 and to the first input terminal of the multiplexer 302. The sink mode threshold detector 220 has a first input (e.g., an inverting or negative input) terminal at which Vref2 is provided, such as by coupling the first input terminal of the sink/source mode detector 202 to any other suitable terminal. The sink mode threshold detector 220 further has a second input (e.g., a non-inverting or positive input) terminal coupled to the second terminal of the switch 112A. The output terminal of the sink mode threshold detector 220 is coupled to the first input terminal of the logic circuit 204 and to the second input terminal of the multiplexer 302. The multiplexer 302 further has a select, or control, input coupled to the output terminal of the sink/source mode detector 202, and an output terminal coupled to a terminal 312 at which the isolated digital input circuit 102 provides the data output signal, such as to the controller 106.

The diode 304 has an anode coupled to the second I/O terminal 134 and has a cathode. The current limiting circuit 306 has an input terminal coupled to the cathode of the diode 304 and an output terminal coupled to the first I/O terminal 132. The diode 308 has a cathode coupled to the second I/O terminal 134 and has a cathode. The current limiting circuit

310 has an input terminal coupled to the first I/O terminal 132 and has an output terminal coupled to the anode of the diode 308.

In an example of operation of the isolated digital input circuit 102 of FIG. 3, the sink/source mode detector 202 compares a voltage (VLED) provided at the second I/O terminal 134 to Vref1. Responsive to VLED having a value greater than Vref1, the sink/source mode detector 202 provides a mode signal indicating that the isolated digital input circuit 102 is operating in the source mode of operation. In an example, the isolated digital input circuit 102 provides the mode signal at a terminal 314, such as to the controller 106. For example, the sink/source mode detector 202 provides the mode signal having a deasserted, or logic low, value. Conversely, responsive to VLED having a value less than Vref1, the sink/source mode detector 202 provides the mode signal indicating that the isolated digital input circuit 102 is operating in the sink mode of operation. For example, the sink/source mode detector 202 provides the mode signal having an asserted, or logic high, value.

The source mode threshold detector 218 compares a voltage (VIN) provided at the second I/O terminal 134 to Vref2. Responsive to VIN having a value greater than Vref2, the source mode threshold detector 218 provides an output signal having a logic low value, indicating that the switch 112A is open. Conversely, responsive to VIN having a value less than Vref2, the source mode threshold detector 218 provides an output signal having a logic high value indicating that the switch 112A is closed. Similarly, the sink mode threshold detector 220 compares VIN to Vref2.

Responsive to VIN having a value greater than Vref2, the sink mode threshold detector 220 provides an output signal having a logic high value indicating that the switch 112A is closed. Conversely, responsive to VIN having a value less than Vref2, the sink mode threshold detector 220 provides an output signal having a logic low value indicating that the switch 112A is open.

Responsive to the switch 112A being closed, the isolated digital input circuit 102 controls one of the LEDs 108A, 110A to be illuminated, such as via the diode 304 and the current limiting circuit 306, or the diode 308 and the current limiting circuit 310, respectively.

Responsive to the mode signal having a logic low value and the output signal of the source mode threshold detector 218 having a logic high value, the logic circuits 206 and 208 control the switch 210 to close to form a current path between the voltage supply terminal 215 and the second I/O terminal 134. This may cause an LED, such as the LED 108A, coupled to the second I/O terminal 134 to not be illuminated, such as resulting from approximately no difference in voltage potential existing across the LED. Similarly, responsive to the mode signal having a logic high value and the output signal of the sink mode threshold detector 220 having a logic high value, the logic circuit 210 controls the switch 212 to close to form a current path between the ground terminal 130 and the second I/O terminal 134. This may cause an LED, such as the LED 110A, coupled to the second I/O terminal 134 to not be illuminated, such as resulting from approximately no difference in voltage potential existing across the LED.

In addition, responsive to the mode signal having a logic high value, the sink/source mode detector 202 controls the multiplexer 302 to provide the output signal of the sink mode threshold detector 220 as the data output signal of the isolated digital input circuit 102 at the terminal 312. Conversely, responsive to the mode signal having a logic low value, the sink/source mode detector 202 controls the multiplexer 302 to provide the output signal of the source mode threshold detector 218 as the data output signal of the isolated digital input circuit 102 at the terminal 312. In some examples, the isolated digital input circuit 102 also provides the mode signal as a second output signal of the isolated digital input circuit 102 at the terminal 314.

The diodes 304, 308 may be blocking diodes, and the current limiting circuits 306, 310 may limit an amount of current flowing in the digital input circuit 102. For example, in the sink mode of operation, the diode 304 blocks reverse current flow to the common terminal 114 and the current limiting circuit 306 limits an amount of current flowing in the digital input circuit 102 to Ilim. In some examples, the current limiting circuit 306 includes a current source (not shown) to provide Ilim. In examples in which the switch 112A is closed, the current limiting circuit 306 limits an amount of current drawn from the voltage supply terminal 128 to Ilim. In examples in which the switch 112A is open, the current limiting circuit 306 pulls the first I/O terminal of the digital input circuit 102 down to approximately equal the voltage provided at the second I/O terminal of the isolated digital input circuit 102 (e.g., approximately GND). Conversely, in the source mode of operation, the diode 308 blocks reverse current flow to the common terminal 116 and the current limiting circuit 310 limits an amount of current flowing in the digital input circuit 102 to Ilim. In some examples, the current limiting circuit 310 includes a current source (not shown) to provide Ilim. In examples in which the switch 112A is closed, the current limiting circuit 310 limits an amount of current drawn from the voltage supply terminal 128 to Ilim. In examples in which the switch 112A is open, the current limiting circuit 310 pulls the first I/O terminal of the digital input circuit 102 up to approximately equal the voltage provided at the second I/O terminal of the isolated digital input circuit 102 (e.g., approximately VDD).

Although not shown in FIG. 3, in some examples, a resistor or other impedance element may be coupled between the second terminal of the switch 112A and the isolated digital input circuit 102 (such as between the second terminal of the switch 112A and the first I/O terminal 132). In such examples, a value of resistance of the resistor may alter a value of Vref2. For example, Vref2 may have a particular minimum value specified at a time of manufacture of the isolated digital input circuit 102. To maintain Vref2 at approximately that minimum value, the switch 112A may be coupled to the first I/O terminal 132 without an intervening impedance element. However, by coupling an impedance element having a non-zero impedance between the second terminal of the switch 112A and the first I/O terminal 132, the value of Vref2 may be changed. For example, the value of Vref2 may be changed to approximately equal the minimum value specified at the time of manufacture plus a sum of the impedance of the impedance element multiplied by Ilim, as described above. In this way, Vref2 may be controllable or programmable, such as to adapt the isolated digital input circuit 102 to various application environments or use cases.

Figure 4:
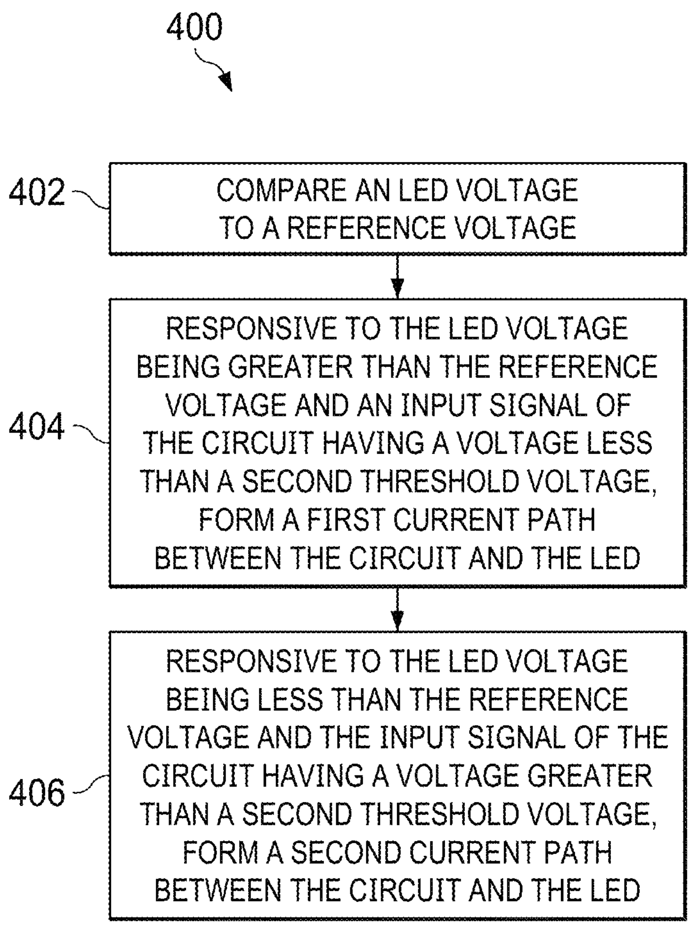
FIG. 4 is a flowchart of an example method of illuminating a LED.

FIG. 4 is a flowchart of an example method 400 of illuminating a LED. In some examples, the method 400 is implemented at least in part by an isolated digital input circuit, such as the isolated digital input circuit 102. For example, the method 400 is implemented at least in part by any combination of the sink/source mode detector 202, the logic circuit 204, 206, 208, the switches 210, 212, the source mode threshold detector 218, and/or the sink mode threshold detector 220 to cause an LED, such as one of the LEDs 108A, 110A to become illuminated.

At operation 402, an LED voltage is compared to a reference voltage. In some examples, the LED voltage has a value of approximately zero volts, or approximately a diode drop voltage of the LED. In other examples, the LED voltage has a value of approximately VDD, or approximately VDD minus a diode drop voltage of the LED. In some examples, the LED is an LED such as the LED 108A or the LED 110A. The LED may be coupled to a circuit, such as the isolated digital input circuit 102, which may perform the comparison. For example, the comparison may be performed by the sink/source mode detector 202 of the isolated digital input circuit 102, as described above herein.

At operation 404, responsive to the LED voltage being greater than the reference voltage and an input signal of the circuit having a voltage less than a second threshold voltage, a first current path is formed between the circuit and the LED. In some examples, the first current path causes approximately no current to flow through the LED because approximately no difference in voltage potential exists across the LED. For example, responsive to the LED voltage being greater than the reference voltage, and the input signal of the circuit having a voltage greater than a second threshold voltage, a first switch is controlled to close or form a conductive path. Responsive to the first switch closing, the first current path is formed through the circuit between a voltage supply terminal, which may be coupled to a voltage supply, and an I/O terminal of the circuit, which may be coupled to a first terminal of the LED. The LED may have a second terminal also coupled to the voltage supply terminal. In this way, approximately no voltage differential may exist across the LED and the LED may not be illuminated. Otherwise, such as responsive to the LED voltage being greater than the reference voltage and the input signal of the circuit having a voltage greater than the second threshold voltage, the first current path may not be formed, and the LED may be illuminated.

At operation 406, responsive to the LED voltage being less than the reference voltage and the input signal of the circuit having a voltage greater than the second threshold voltage, a second current path is formed between the circuit and the LED. In some examples, the second current path causes approximately no current to flow through the LED because approximately no difference in voltage potential exists across the LED. For example, responsive to the LED voltage being less than the reference voltage, and an input signal of the circuit having a voltage less than a second threshold voltage, a second switch is controlled to close or form a conductive path. Responsive to the second switch closing, the second current path is formed through the circuit between a ground terminal, at which a ground voltage potential may be provided, and an I/O terminal of the circuit, which may be coupled to a first terminal of the LED. The LED may have a second terminal also coupled to the ground terminal. In this way, approximately no voltage differential may exist across the LED and the LED may not be illuminated. Otherwise, such as responsive to the LED voltage being less than the reference voltage and the input signal of the circuit having a voltage less than the second threshold voltage, the second current path may not be formed, and the LED may be illuminated.

Figure 5:
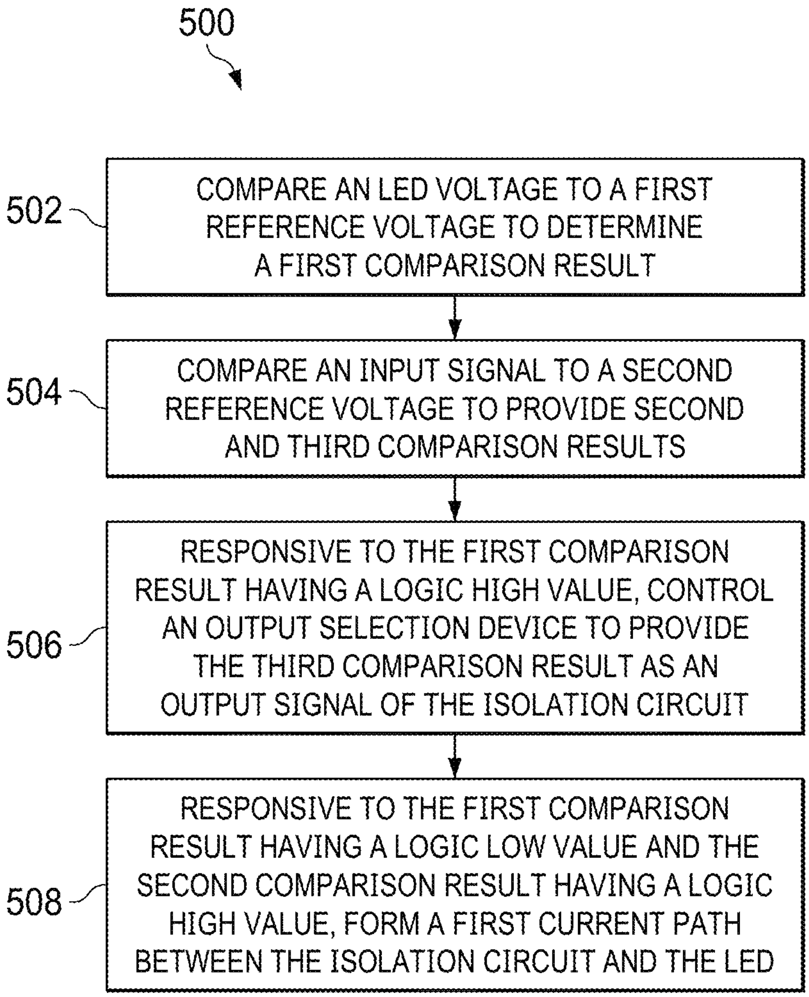
FIG. 5 is a flowchart of an example method of performing digital signal isolation.

FIG. 5 is a flowchart of an example method 500 of performing digital signal isolation. In some examples, the method 500 is implemented at least in part by an isolated digital input circuit, such as the isolated digital input circuit 102.

At operation 502, an LED voltage is compared to a reference voltage to determine a first comparison result. In some examples, the LED voltage has a value of approximately zero volts, or approximately a diode drop voltage of the LED. In other examples, the LED voltage has a value of approximately VDD, or approximately VDD minus a diode drop voltage of the LED. In some examples, the LED is an LED such as the LED 108A or the LED 110A. The LED may be coupled to an isolation circuit, such as the isolated digital input circuit 102, which may perform the comparison. For example, the comparison may be performed by a first comparison circuit, such as the sink/source mode detector 202 of the isolated digital input circuit 102, as described above herein.

At operation 504, an input signal is compared to a second reference voltage to provide second and third comparison results. In some examples, the input signal is compared to the second reference voltage via a first circuit, such as the source mode threshold detector 218, to provide the second comparison result. Responsive to the input signal having a value greater than the second reference voltage, the first circuit provides the second comparison result having a logic low value. Otherwise, the first circuit provides the second comparison result having a logic high value. The input signal may also be compared to the second reference voltage via a second circuit, such as the sink mode threshold detector 220, to provide the third comparison result. Responsive to the input signal having a value greater than the second reference voltage, the second circuit provides the third comparison result having a logic high value. Otherwise, the second circuit provides the third comparison result having a logic low value.

At operation 506, responsive to the first comparison result having a logic high value, the first comparison circuit controls an output selection device, such as a multiplexer, to provide the third comparison result as an output signal of the isolation circuit. Conversely, responsive to the first comparison result having a logic low value, the first comparison circuit controls the output selection device to provide the second comparison result as the output signal of the isolation circuit.

At operation 508, responsive to the first comparison result having a logic low value and the second comparison result having a logic high value, a first current path is formed between the isolation circuit and the LED. In some examples, the first current path causes the LED to not be illuminated. For example, responsive to the LED voltage being greater than the reference voltage, and an input signal of the isolation circuit having a voltage greater than a second threshold voltage, a first switch is controlled to close or form a conductive path. Responsive to the first switch closing, the first current path is formed through the circuit between a voltage supply terminal, which may be coupled to a voltage supply, and an I/O terminal of the circuit, which may be coupled to the LED. The LED may have a second terminal coupled to the voltage supply. In this way, approximately no voltage differential exists across the LED and the LED is controlled to not be illuminated.

Conversely, responsive to the first comparison result having a logic high value and the third comparison result having a logic high value, a second current path is formed between the isolation circuit and the LED. In some examples, the second current path causes the LED to not be illuminated. For example, responsive to the LED voltage being less than the reference voltage, and an input signal of the circuit having a voltage less than a second threshold voltage, a second switch is controlled to close or form a conductive path. Responsive to the second switch closing, the second current path is formed through the circuit between a ground terminal, at which a ground voltage potential may be provided, and an I/O terminal of the circuit, which may be coupled to the LED. The LED may have a second terminal coupled to the ground terminal. In this way, approximately no voltage differential exists across the LED and the LED is controlled to not be illuminated.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

Modifications are possible in the described examples, and other examples are possible, within the scope of the claims.

What is claimed is:

1. A circuit, comprising:

a sink/source mode detector having an input terminal and an output terminal, the input terminal of the sink/source mode detector coupled to a first input/output (I/O) terminal of the circuit;

a first logic circuit having an output terminal and having first and second input terminals, the second input terminal of the first logic circuit coupled to the output terminal of the sink/source mode detector;

a second logic circuit having an input terminal and an output terminal, the input terminal of the second logic circuit coupled to the output terminal of the sink/source mode detector;

a third logic circuit having an output terminal and having first and second input terminals, the second input terminal of the third logic circuit coupled to the output terminal of the second logic circuit;

a first switch having a control terminal and first and second terminals, the first terminal of the first switch coupled to a voltage supply terminal, the second terminal of the first switch coupled to the first I/O terminal of the circuit, and the control terminal of the first switch coupled to the output terminal of the third logic circuit; and a second switch having a control terminal and first and second terminals, the first terminal of the second switch coupled to the first I/O terminal of the circuit, the second terminal of the second switch coupled to a ground terminal, and the control terminal of the second switch coupled to the output terminal of the first logic circuit.

2. The circuit of claim 1, further comprising:

a source threshold detector having an input terminal and an output terminal, the input terminal of the source threshold detector coupled to a second I/O terminal of the circuit; and a sink threshold detector having an input terminal and an output terminal, the input terminal of the sink threshold detector coupled to the second I/O terminal of the circuit.

3. The circuit of claim 2, wherein:

the source threshold detector comprises a first comparator having first and second input terminals, the first input terminal of the first comparator coupled to the second I/O terminal of the circuit, and the second input terminal of the first comparator coupled to a first reference signal terminal; and the sink threshold detector comprises a second comparator having first and second input terminals, the first input terminal of the second comparator coupled to the second I/O terminal of the circuit, and the second input terminal of the second comparator coupled to a second reference signal terminal.

4. The circuit of claim 3, further comprising:

a first diode having an anode and a cathode, the anode of the first diode coupled to the second I/O terminal of the circuit;

a first current source having first and second terminals, the first terminal of the first current source coupled to the cathode of the first diode, and the second terminal of the first current source coupled to the first I/O terminal of the circuit;

a second diode having an anode and a cathode, the cathode of the second diode coupled to the second I/O terminal of the circuit; and a second current source having first and second terminals, the first terminal of the second current source coupled to the anode of the second diode, and the second terminal of the second current source coupled to the first I/O terminal of the circuit.

5. The circuit of claim 1, further comprising:

a first light emitting diode (LED) having an anode and a cathode, the anode of the first LED coupled to the first I/O terminal of the circuit, and the cathode of the first LED coupled to a first common terminal of the circuit; and a second LED having an anode and a cathode, the cathode of the second LED coupled to the first I/O terminal of the circuit and the anode of the second LED coupled to the first common terminal of the circuit.

6. The circuit of claim 1, further comprising a resistor having first and second terminals, the first terminal of the resistor coupled to a second common terminal of the circuit.

7. The circuit of claim 6, further comprising:

a first diode having an anode and a cathode, the anode of the first diode coupled to the second terminal of the resistor, and the cathode of the first diode coupled to a voltage reference terminal of the circuit;

a second diode having an anode and a cathode, the anode of the second diode coupled to a ground reference terminal of the circuit, and the cathode of the second diode coupled to a first common terminal of the circuit;

a third diode having an anode and a cathode, the cathode of the third diode coupled to the anode of the first diode, and the anode of the third diode coupled to the anode of the second diode; and a fourth diode having an anode and a cathode, the cathode of the fourth diode coupled to the cathode of the first diode, and the anode of the fourth diode coupled to the cathode of the second diode.

8. The circuit of claim 1, wherein the sink/source mode detector comprises a comparator having an output terminal and first and second input terminals, the first input terminal of the comparator coupled to the first I/O terminal of the circuit, the second input terminal coupled to a third reference signal terminal, and in which the output terminal of the comparator is the output terminal of the sink/source mode detector.

9. The circuit of claim 1, wherein the first and third logic circuits are each AND logic circuits and the second logic circuit is an inverter.

10. A circuit, comprising:

a sink/source mode detector having an input terminal and an output terminal, the input terminal of the sink/source mode detector coupled to a first input/output (I/O) terminal of the circuit, the sink/source mode detector configured to:

compare a voltage provided at the first I/O terminal of the circuit to a first reference signal;

determine, responsive to the voltage provided at the first I/O terminal exceeding the first reference signal, that the circuit is in a source mode;

determine, responsive to the voltage provided at the first I/O terminal not exceeding the first reference signal, that the circuit is in a sink mode;

responsive to determining that the circuit is in the source mode and an input signal of the circuit has a value less than a second reference signal, control a first switch to form a first current path between a voltage supply terminal and the first I/O terminal of the circuit; and responsive to determining that the circuit is in the sink mode and the input signal has a value greater than the second reference signal, control a second switch to form a second current path between a ground terminal and the first I/O terminal of the circuit.

11. The circuit of claim 10, wherein:

responsive to determining that the circuit is in the source mode, the sink/source mode detector is configured to control a signal selection circuit to provide a first comparison result as an output signal of the circuit; and responsive to determining that the circuit is in the sink mode, the sink/source mode detector is configured to control the signal selection circuit to provide a second comparison result as the output signal of the circuit.

12. The circuit of claim 10, wherein the sink/source mode detector is configured to compare the voltage provided at the first I/O terminal to the first reference signal having a value equal to one-half of a supply voltage of the circuit.

* * * * *